(12) United States Patent
Cho

(10) Patent No.: US 9,484,081 B2
(45) Date of Patent: *Nov. 1, 2016

(54) SEMICONDUCTOR DEVICE HAVING TRANSISTOR AND SEMICONDUCTOR MEMORY DEVICE USING THE SAME

(71) Applicant: SK hynix Inc., Gyeonggi-do (KR)

(72) Inventor: Young-Hoon Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/964,031

(22) Filed: Dec. 9, 2015

(65) Prior Publication Data

US 2016/0086653 A1 Mar. 24, 2016

Related U.S. Application Data

(63) Continuation of application No. 13/843,397, filed on Mar. 15, 2013, now Pat. No. 9,269,413.

(30) Foreign Application Priority Data

Dec. 7, 2012 (KR) .................. 10-2012-0141949

(51) Int. Cl.
*G11C 5/14* (2006.01)
*G11C 11/4094* (2006.01)
*G11C 7/12* (2006.01)
*G11C 11/408* (2006.01)

(52) U.S. Cl.
CPC ............. *G11C 11/4094* (2013.01); *G11C 7/12* (2013.01); *G11C 11/4085* (2013.01)

(58) Field of Classification Search
CPC ......... G11C 5/147; G11C 5/145; G11C 8/10; G11C 8/08; G11C 11/404
USPC ............................. 365/189.09, 230.06, 148
See application file for complete search history.

(56) References Cited

U.S. PATENT DOCUMENTS

| | | | |
|---|---|---|---|
| 2002/0054503 A1* | 5/2002 | Lee .................. | G11C 7/12 365/149 |
| 2010/0091554 A1* | 4/2010 | Takahashi ............. | G11C 7/12 365/149 |

* cited by examiner

Primary Examiner — Huan Hong
(74) Attorney, Agent, or Firm — IP & T Group LLP

(57) ABSTRACT

Semiconductor device capable of preventing off-leakage of the transistor may include a pulse voltage generator configured to generate a pulse voltage, and a transistor configured to have a gate provided with the pulse voltage. The transistor is in an off state in response to the pulse voltage.

11 Claims, 7 Drawing Sheets

US 9,484,081 B2

SEMICONDUCTOR DEVICE HAVING TRANSISTOR AND SEMICONDUCTOR MEMORY DEVICE USING THE SAME

CROSS-REFERENCE TO RELATED APPLICATIONS

This application is a continuation of U.S. patent application Ser. No. 13/843,397 filed on Mar. 15, 2013, which claims priority of Korean Patent Application No. 10-2012-0141949, filed on Dec. 7, 2012. The disclosure of each of the foregoing applications is incorporated herein by reference in its entirety.

BACKGROUND

1. Field

Exemplary embodiments of the present invention relate to a technology of manufacturing a semiconductor device, and more particularly, to a semiconductor device capable of preventing off-leakage of a transistor and a semiconductor memory device using the same.

2. Description of the Related Art

A semiconductor device, for example, a semiconductor memory device such as a DRAM, transfers data of memory cells (MC) to bit lines BLs by supplying a specific voltage to word lines WLs for a predetermined time in an active operation mode to activate the word lines WLs and includes a bit line sense amplifier (BLSA) sensing and amplifying data of bit lines. In a read operation mode, the data amplified by the bit line sense amplifier are output to the outside through a data transmission line. Further, in a write operation mode, external data transmitted through the data transmission line are transferred to the bit lines and stored in the memory cells.

Meanwhile, in a precharge operation mode, the device isolates memory cells from the bit lines by supplying the specific voltage to the word lines for a predetermined time to inactivate the word lines and waits until a next active operation mode by precharging the bit lines with precharge voltage (VBLP). For reference, a read operation and a write operation are performed between the active operation and the precharge operation.

Conventional semiconductor memory devices often suffer from deterioration of its characteristics due to off-leakage in the precharge operation mode, which will be described in detail with reference to FIGS. 1, 2A, and 2B.

FIG. 1 is a block diagram schematically illustrating a semiconductor device in accordance with the prior art and FIGS. 2A and 2B are diagrams for describing problems in accordance with the prior art.

As illustrated in FIG. 1, the semiconductor memory device in accordance with the prior art may include a memory unit 110. The memory unit 110 has a plurality of memory cells, each of which comprises a cell transistor 101 and a data storage unit 102 such as a capacitor, a plurality of word lines WLs and a plurality of bit lines BLs connected with the plurality of memory cells. The device may have a word line driver 120 and a bit line sense amplifier 130 each connected with the word lines WLs and the bit lines BLs extending from the memory unit 110.

In accordance with the prior art, in order to suppress the off-leakage of the cell transistor 101 in the precharge operation mode, as illustrated in FIG. 2A, the device increases threshold voltage of the cell transistor 101 by supplying negative voltage, for example, back bias voltage (VBB) lower than ground voltage to a substrate on which the cell transistor 101 is formed while supplying the ground voltage VSS to the word lines WLs, to suppress off-leakage.

However, the back bias voltage VBB supplied to the substrate cannot function as a main factor controlling the threshold voltage of the cell transistor 101 and leads to junction leakage in a source/drain of the cell transistor 101, such that the prior art has a limitation in suppressing the off-leakage.

In accordance with another prior art to alleviate the above concerns, as illustrated in FIG. 2B, the device supplies the negative voltage, for example, negative word line voltage VBBW, lower than the ground voltage VSS, to the word lines WLs in a precharge operation mode, instead of supplying the back bias voltage VBB to the substrate.

However, when the word lines WL are supplied with negative voltage, a potential difference between the data storage unit 102 and the word lines WLs (or gates) is increased, which may lead to a gate induced drain leakage (GIDL). Since the GIDL becomes a major factor of the off-leakage as integration is increased, a semiconductor memory device staying in off state without the GIDL is in demand.

SUMMARY

An embodiment of the present invention is directed to a semiconductor device capable of preventing off-leakage of a transistor and a semiconductor memory device using the same.

In accordance with an embodiment of the present invention, a semiconductor device, including a pulse voltage generator configured to generate a pulse voltage, and a transistor configured to have a gate provided with the pulse voltage. The transistor is in an off state in response to the pulse voltage.

In accordance another embodiment of the present invention, a semiconductor memory device includes a memory unit configured to include a plurality of memory cells including cell transistors and data storage units connected with drains of the cell transistors, a plurality of first conductive lines connected with gates of the cell transistors, and a plurality of second conductive lines connected with sources of the cell transistors, and a pulse voltage generator configured to generate a pulse voltage, wherein the first conductive line is supplied with the pulse voltage for an inactivation of the first conductive line, and the cell transistor is in an off state in response to the pulse voltage.

In accordance with still another embodiment of the present invention, a semiconductor memory device includes a memory unit configured to include a plurality of memory cells including cell transistors and data storage units connected with drains of the cell transistors, a plurality of word lines connected with gates of the cell transistors, and a plurality of bit lines connected with sources of the cell transistors, and a pulse voltage generator configured to generate a first pulse voltage having a first frequency and a second pulse voltage having a second frequency lower than the first frequency. The word line is supplied with the first pulse voltage for an inactivation of the word line, and the cell transistor is in an off state in response to the first pulse voltage, and the word line is supplied with the second pulse voltage for an activation of the word line, and the cell transistor is in an on state in response to the second pulse voltage.

In accordance with still yet another embodiment of the present invention, a semiconductor device includes a pulse voltage generator configured to generate a first pulse voltage having a first frequency and a second pulse voltage having a second frequency lower than the first frequency, and a transistor configured to have a gate provided with the first pulse voltage and the second pulse voltage.

The transistor is in an off state in response to the first pulse voltage and is in an on state in response to the second pulse voltage. Each of the first pulse voltage and the second pulse voltage may swing between a positive voltage and a ground voltage or between a positive voltage and a negative voltage. A magnitude of the positive voltage may be larger than a magnitude of the negative voltage. The first frequency may be higher than a threshold frequency preventing formation of a channel of the transistor, and the second frequency may be lower than the threshold frequency. The threshold frequency may be approximately 100 kHz In accordance with further still yet another embodiment of the present invention, a semiconductor memory device includes a memory unit configured to include a plurality of memory cells including cell transistors and data storage units connected with drains of the cell transistors, a plurality of word lines connected with gates of the cell transistors, and a plurality of bit lines connected with sources of the cell transistors, and a pulse voltage generator configured to generate a pulse voltage. The word line is supplied with the pulse voltage for a predetermined time in response to a precharge command to turn-off the cell transistor.

The pulse voltage may swing between a positive voltage and a ground voltage or between a positive voltage and a negative voltage. A magnitude of the positive voltage may be larger than a magnitude of the negative voltage. A drain of the cell transistor may have a potential higher than the ground voltage. The pulse voltage may have a frequency higher than a threshold frequency preventing formation of a channel of the transistor. The threshold frequency may be approximately 100 kHz.

DETAILED DESCRIPTION

Figure 1:
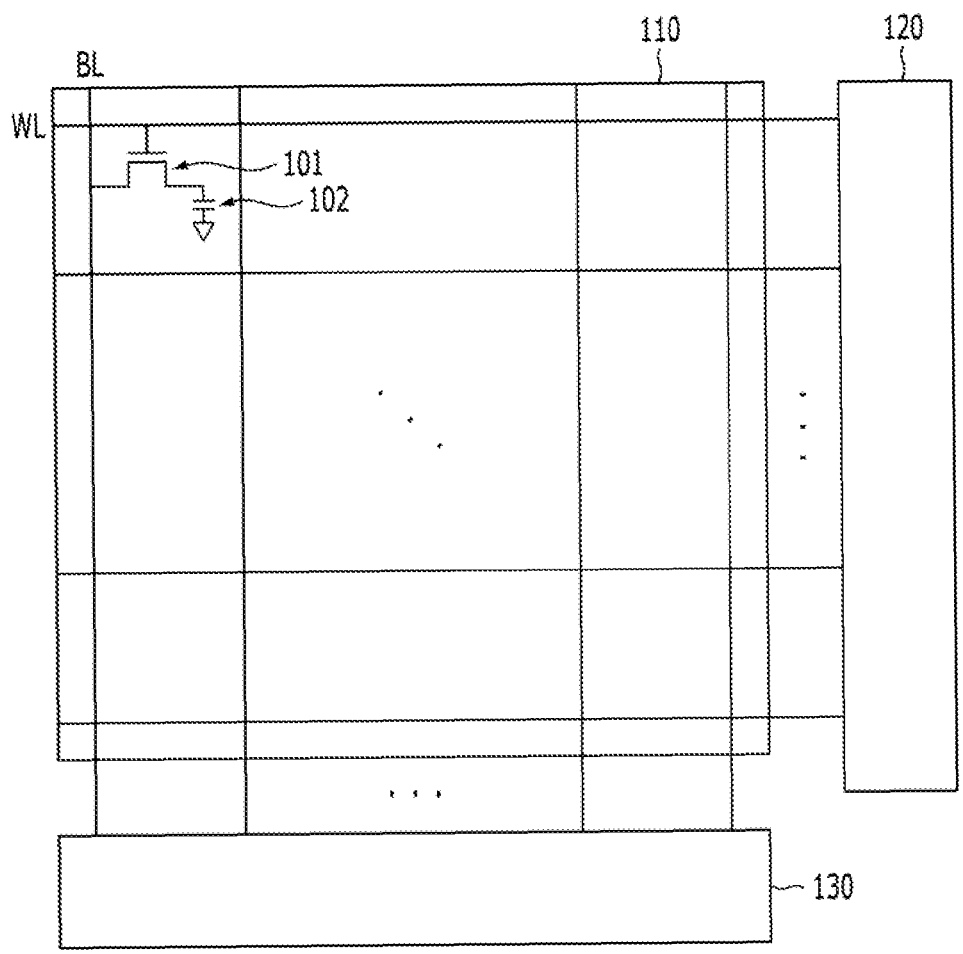
FIG. 1 is a block diagram illustrating a semiconductor device in accordance with the related art.
Figure 2A:
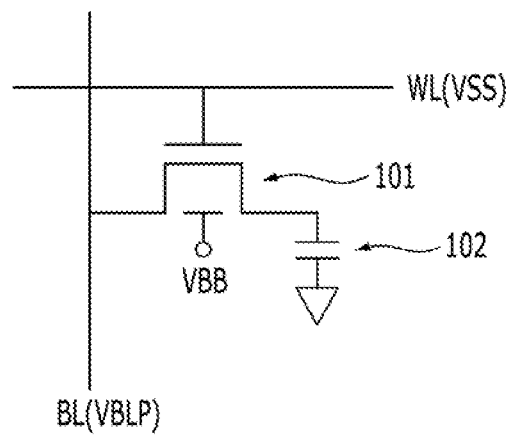
FIGS. 2A and 2B are diagrams illustrating concerns in accordance with the prior art.
Figure 2B:
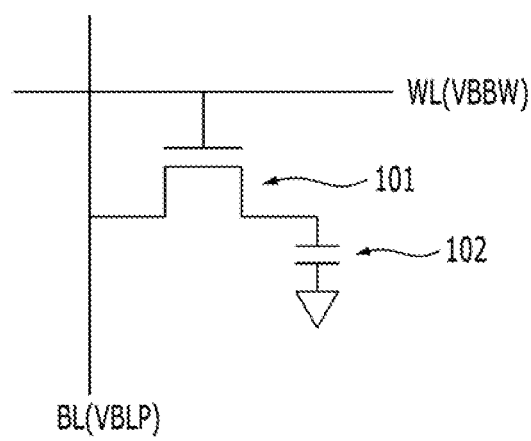

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an Intermediate component. In addition, a singular form may include a plural form as long as it is not specifically mentioned in a sentence.

Embodiments of the present invention to be described below relate to a semiconductor device capable of preventing off-leakage of a transistor and a semiconductor memory device using the same. In detail, the embodiments of the present invention provide a semiconductor device capable of preventing gate induced drain leakage (GIDL) while preventing junction leakage of a source/drain in an off state of a transistor. To this end, the embodiments of the present invention include a transistor and a pulse voltage generator, of which the output terminal is connected with a gate of the transistor. The pulse voltage generator swings between positive voltage and ground voltage or between positive voltage and negative voltage and generates pulse voltage having a frequency controlling a channel formation of a transistor supplied to the gate of the transistor.

Hereinafter, prior to describing the semiconductor device in accordance with the embodiment of the present invention, a principle of controlling a channel formation of a transistor using pulse voltage having a frequency will be described.

Figure 3:
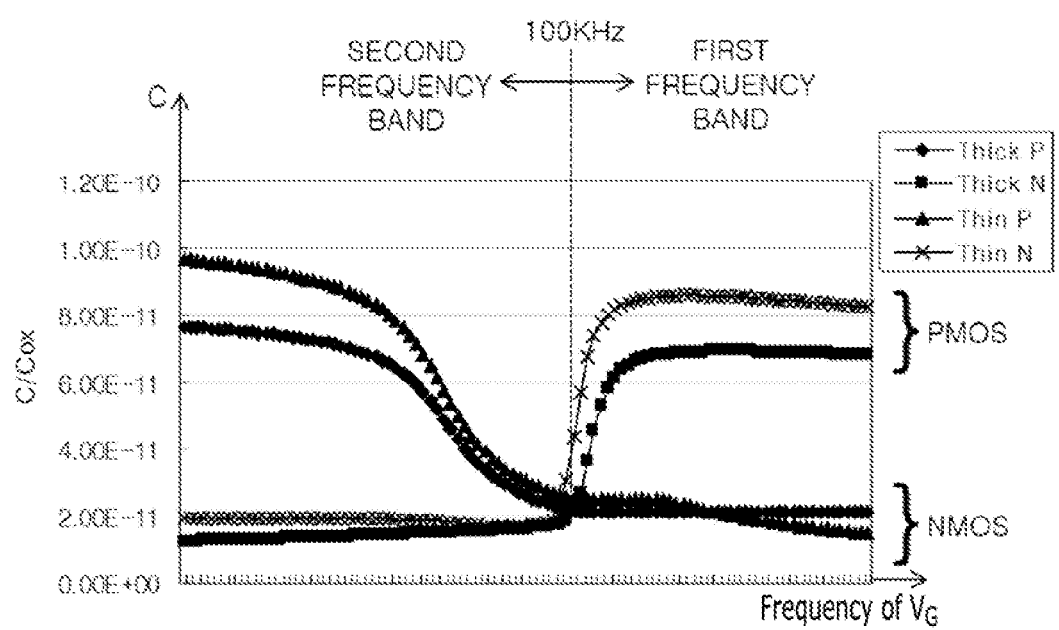
FIG. 3 is a graph illustrating gate-capacitance $V_G$-C.
Figure 4A:
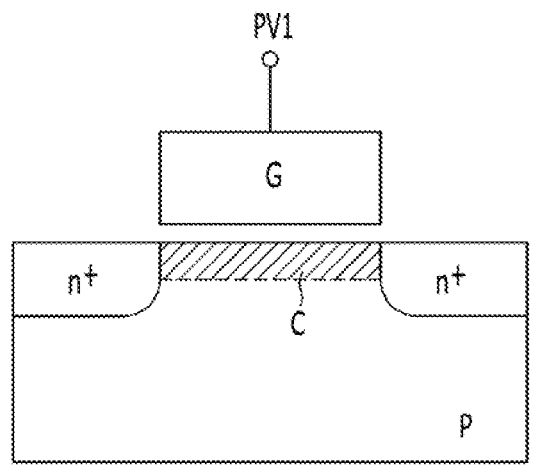
FIG. 4A is a cross-sectional view illustrating a case in which pulse voltage in a low frequency band is supplied to a gate.
Figure 4B:
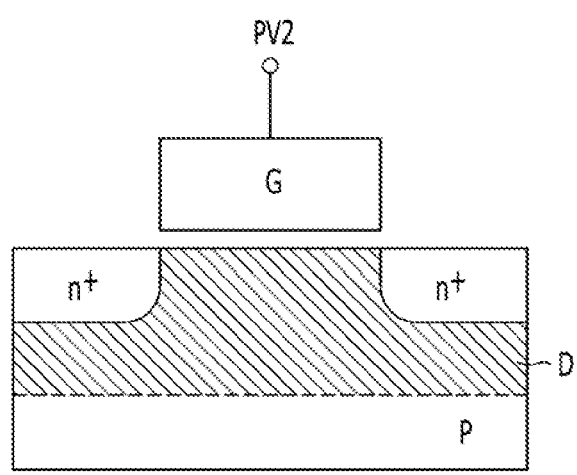
FIG. 4B is a cross-sectional view illustrating a case in which pulse voltage in a high frequency band is supplied to the gate.

FIGS. 3, 4A, and 4B are diagrams for describing whether the channel of the transistor is formed in accordance with the pulse voltage supplied to the gate. In detail, FIG. 3 is a graph of gate-capacitance $V_G$-C of the transistor, FIG. 4A is a cross-sectional view of a transistor illustrating a case in which pulse voltage in a low frequency band is supplied to a gate, and FIG. 4B is a cross-sectional view of a transistor illustrating a case in which pulse voltage in a high frequency band is supplied to the gate.

As shown in FIG. 3, a Y axis of the graph indicates capacitance of a capacitor configured of a gate, a gate insulating film, and a substrate (or well). An X axis of the graph indicates frequency of pulse voltage ($V_G$) supplied to the gate. As a value of the X axis is increased, the frequency of pulse voltage becomes higher. That is, the graph means that as a value on the X axis is increased, the frequency of pulse voltage supplied to the gate moves from a low frequency band to a high frequency band. The pulse voltage supplied to the gate swings between the positive voltage, for example, 3V and the negative voltage, for example, -3V. That is, a maximum value of the pulse voltage is 3V, a minimum value thereof is -3V, and the average voltage value is 0V. In the graphs, the frequency may be divided into a first frequency band and a second frequency band based on a point at which a capacitance value is suddenly changed, that is, a threshold frequency. In this case, the first frequency band may be a high frequency band, the second frequency band may be a low frequency band, and the threshold frequency may be a minimum frequency for preventing the channel from being formed. Further, 'Thick P' and 'Thin P' in the graph mean that as a case in which the conductive type of an impurity region (for example, well) formed on the substrate is a P type, a transistor is NMOS. Further, 'Thick N' and 'Thin N' mean that as a case in which the conductive type of an impurity region (for example, well) formed on the substrate is an N type, a transistor is PMOS. 'Thick' refers to the case in which the thickness of the impurity region formed on the substrate is large and 'Thin' refers to the case in which the thickness of the impurity region is relatively small. Hereinafter, for convenience of explanation, the case in which the transistor is NMOS will be described by way of example.

As illustrated in FIGS. 3 and 4A, when pulse voltage PV1 having a frequency in a second frequency band lower than a threshold frequency is supplied to the gate, electrons that are a minority carrier in a substrate or an impurity region formed on a substrate and electrons generated at a constant speed by a recombination/generation mechanism are attracted to a surface of the substrate under the gate to form a channel C. In this case, a moving speed of electrons that are a minority carrier in response to the pulse voltage PV1 and a generation speed of electrons by the recombination/generation mechanism are faster than the frequency of the pulse voltage PV1 to form the channel C. As a result, the capacitor is configured of the gate, the gate insulating film, and the channel C to have large capacitance.

As illustrated in FIGS. 3 and 4B, when pulse voltage PV2 having a frequency in a first frequency band larger than the threshold frequency is supplied to the gate, the frequency of the pulse voltage PV2 is faster than a moving speed of electrons that are a minority carrier and a generation speed of electrons by the recombination/generation mechanism, such that the channel is not formed and a depletion region D on the substrate under the gate is suddenly expanded. Therefore, the serial capacitance of the capacitor by the gate insulating film and the capacitor by the depletion region D have lower capacitance than the capacitance when the pulse voltage PV1 of the second frequency band is supplied to the gate.

As illustrated in graph in FIG. 3, forming of the channel of the transistor may be controlled with variation of a capacitance value, which means that the turn-on/off state of the transistor may be controlled with the frequency of pulse voltage supplied to the gate.

Further, it is possible to set frequency bands for controlling the channel formation of the transistor based on the graph illustrated in FIG. 3. In detail, the capacitance value suddenly changes at the frequency of 100 kHz. When the pulse voltage in a frequency band lower than 100 kHz, that is, 0 kHz to 99 kHz is supplied to the gate, the channel of the transistor may be formed. For reference, 0 kHz that does not have a frequency means level voltage keeping a specific voltage value for a predetermined time. In addition, when the pulse voltage having a frequency of 100 kHz or higher is supplied to the gate, it is possible to prevent the channel of the transistor from being formed. Accordingly, approximately 100 kHz is a threshold frequency for controlling formation of the channel of the transistor. That is, the transistor may stay in an off state in response to the pulse voltage having a frequency higher than the threshold frequency and the transistor may stay in an on state in response to the pulse voltage having a frequency lower than the threshold frequency.

Hereinafter, the semiconductor device in accordance with the embodiment of the present invention will be described based on the foregoing principle of the present invention. Hereinafter, for convenience of explanation, the case in which the transistor is NMOSFET will be described as an example. Further, the embodiments of the present invention may be applied to even the case in which the transistor is PMOSFET.

Figure 5:
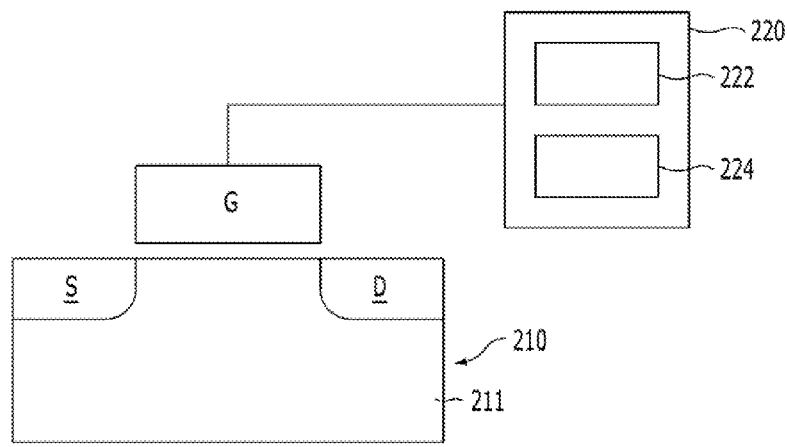
FIG. 5 is a diagram illustrating a semiconductor device in accordance with an embodiment of the present invention.

FIG. 5 is a diagram illustrating a semiconductor device in accordance with an embodiment of the present invention.

As illustrated in FIG. 5, the semiconductor device in accordance with the embodiment of the present invention may include a pulse voltage generator 220 and a transistor 210 of which the gate G is provided with the output of the pulse voltage generator 220. In this configuration, the pulse voltage generator 220 generates first pulse voltage having a first frequency and second pulse voltage having a second frequency lower than the first frequency. The transistor 210 may stay in an off state in response to the first pulse voltage and the transistor 210 may stay in an on state in response to the second pulse voltage. Here, the on state means the state in which the channel is formed on the substrate 211 under the gate G because of the second frequency of the second pulse voltage, and the off state means the state in which the channel is not formed on the substrate 211 under the gate G because of the first frequency of the first pulse voltage.

The transistor 210 may include the gate G formed on the substrate 211 and the source S and drain D formed on the substrate 211 at both sides of the gate G. The substrate 211 is doped with a predetermined impurity (for example, P type impurity) or the transistor 210 may be formed in the impurity region (for example, well) that is formed by doping the substrate 211 with a predetermined impurity (for example, P type impurity). The case in which the gate G is a planar gate is illustrated, but may be of various types. For example, the gate G may be of a type selected from a recess gate, a fin gate, a buried gate, a vertical gate, and the like. The source S and the drain D may be formed by doping the substrate 211 at both sides of the gate G with a predetermined Impurity (for example, N type impurity).

The pulse voltage generator 220 may include a voltage generator 222 that generates multiple voltages with various values. In detail, the voltage generator 222 may generate first voltage that is positive and higher than the ground voltage VSS, and generate second voltage that is the ground voltage VSS or lower than the ground voltage VSS. For example, the first voltage may be higher than the threshold voltage of the transistor 210 and the second voltage may be lower than the threshold voltage of the transistor 210. The first pulse voltage and the second pulse voltage generated from the pulse voltage generator 220 may swing between the first voltage and the second voltage generated from the voltage generator 222. In this case, in order to prevent the GIDL due to the potential difference between the source S/drain D and the gate G of the transistor 210, a magnitude of the first voltage is preferably larger than a magnitude (absolute value) of the second voltage. As a result, average values of the first pulse voltage and the second pulse voltage are positive.

Considering the fact that the source S and the drain D of the transistor is supplied with voltage higher than the ground voltage VSS during the operation, the potential difference between the gate G and the source S/drain D may be minimized in the case in which the average value of the first pulse voltage and the second pulse voltage is positive, such that the GIDL may be suppressed. In addition, the average values of the first pulse voltage and the second pulse voltage may be controlled through control of magnitudes of the first voltage and the second voltage, thereby easily coping with the fluctuation of the voltage supplied to the source S/drain D.

Further, the pulse voltage generator 220 may include a pulse generator 224 that generates a plurality of pulses having different frequencies. In detail, the pulse generator 224 may generate a first frequency and a second frequency lower than the first frequency. In this case, the first frequency and the second frequency are to control formation of the channel of the transistor 210. That is, the first frequency may be higher than the threshold frequency and the second frequency may be lower than the threshold frequency. The threshold frequency is a reference to form the channel of the transistor 210. For example, the threshold frequency may be approximately 100 kHz, the first frequency may be a frequency of 100 kHz or higher, and the second frequency may be a frequency lower than 100 kHz, for example, a frequency ranging from 0 kHz or 99 kHz. The channel of the transistor 210 is not formed in the first frequency and the channel of the transistor 210 is formed in the second frequency.

The semiconductor device in accordance with the embodiment of the present invention includes the pulse voltage generator 220 generating a pulse voltage that swings between voltages of which the average value is positive and that has a frequency controlling the formation of the channel of the transistor 210, thereby preventing the off-leakage of the transistor 210. Further, the embodiment of the present invention may secure the high potential of the gate G with off state of the transistor 210, thereby alleviating the concerns caused by supplying the negative voltage, for example, the negative word line voltage VBBW to the gate G as discussed in the prior art.

In addition, the embodiment of the present invention may control the turn-on/off of the transistor 210 with the pulse voltage generated from the pulse voltage generator 220 to remove the process for controlling the turn-on/off characteristics of the transistor, for example, the ion implantation process, and the like, from the manufacturing processes, thereby improving the productivity of the semiconductor device.

Further, since the transistor 210 has the depletion region expanded on the substrate 211 under the gate G in the state where the first pulse voltage of the first frequency is supplied, the channel may be formed faster compared to the prior art supplying the level voltage to the gate G when the state of the transistor being shifted from turn-off to turn-on. Therefore, it is possible to provide the transistor with high speed operation without separate tuning process.

The semiconductor device in accordance with the embodiment of the present invention may be applied to various devices, systems, or product family. For example, the semiconductor device in accordance with the embodiment of the present invention may be applied to a cell transistor or a peri transistor of the semiconductor memory device, such as a DRAM suffering from GIDL. The embodiments of the present invention may be applied to an electrical test that should be performed without a condition of the GIDL, a DC to AC converter that needs a high-speed switching operation, and the like. Hereinafter, the case in which the semiconductor device in accordance with the embodiment of the present invention is applied to the cell transistor of a DRAM will be described with reference to FIGS. 6 and 7.

Figure 6:
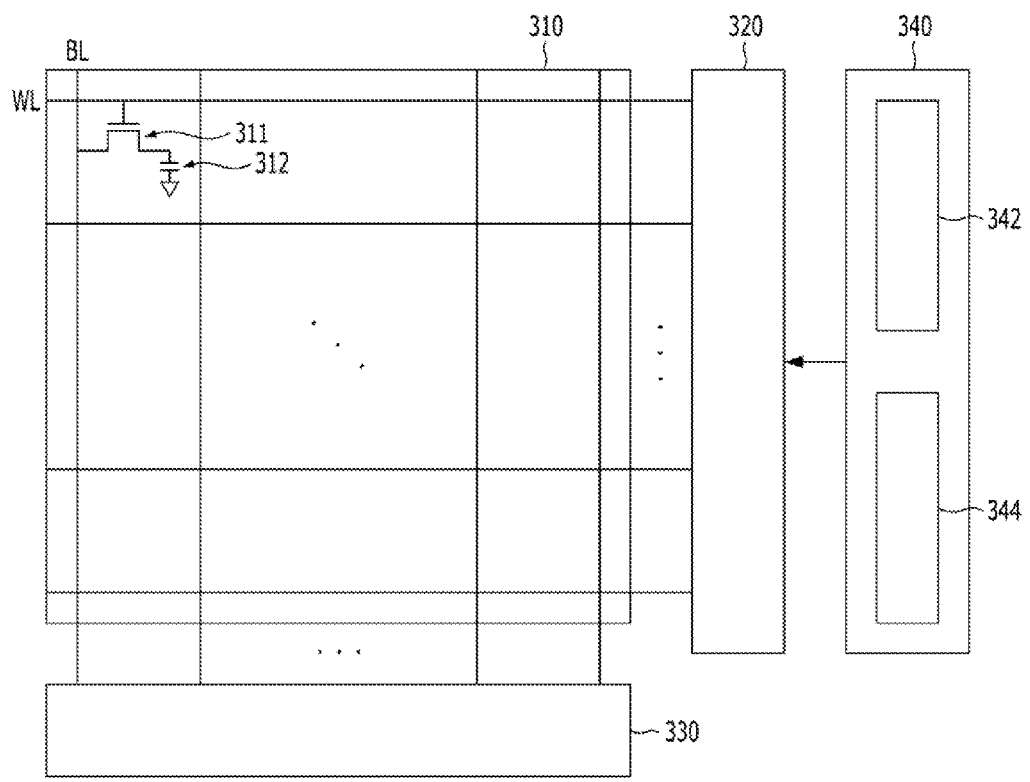
FIG. 6 is a block diagram illustrating a semiconductor memory device in accordance with an embodiment of the present invention.

FIG. 6 is a block diagram illustrating a semiconductor memory device in accordance with the embodiment of the present invention.

As illustrated in FIG. 6, the semiconductor memory device in accordance with the embodiment of the present invention may include a memory unit 310. The memory unit 310 has a plurality of memory cells, each of which comprises a cell transistor 311 and a data storage unit 312 connected with the cell transistors 311, a plurality of word lines WLs and a plurality of bit lines BLs. The device may have a word line driver 320 and a bit line sense amplifier (BLSA) 330 each connected with the word lines and the bit lines extending from the memory unit 310, as well as a pulse voltage generator 340 generating pulse voltage supplied to the word lines. Each of the word line and the bit line may be a conductive line.

The cell transistor 311 may be of various types according to the gate structure. In detail, the cell transistor 311 may be implemented with a gate selected from a planar gate, a recess gate, a fin gate, a buried gate, a vertical gate, and the like. Further, the cell transistor 311 may be NMOS that may be operated at higher speed than PMOS. The data storage unit 312 storing logic information may be a capacitor. In addition, the data storage unit 312 may be a variable resistance element, such as ferroelectrics or phase change materials. The memory cell may be disposed in a matrix form and may be disposed at cross points of the word lines and the bit lines.

The word line connected with the gate of the cell transistors 311 extends to the outside of the memory unit 310 to be connected with the word line driver 320. The word line driver 320 may activate or inactivate a specific word line according to a command. The bit line connected with the source of the cell transistor 311 extends to the outside of the memory unit 310 to be connected with the bit line amplifier 330. The bit line sense amplifier 330 may sense and amplify data carried on the bit lines.

The pulse voltage generator 340 may generate the pulse voltage having a predetermined frequency and allows the word line driver 320 to supply the pulse voltage to the selected word line according to the command when the generated pulse voltage is transferred to the word line driver 320. The word lines may be activated or inactivated according to the supplied pulse voltage. The pulse voltage generator 340 may generate the first pulse voltage having a first frequency and the second pulse voltage having a second frequency lower than the first frequency. When the first pulse voltage is supplied to the word lines, the word lines are inactivated, such that the cell transistor 311 connected with the word lines may become the turn-off state. When the second pulse voltage is supplied to the word lines, the word lines are activated, such that the cell transistor 311 connected with the word lines may become the turn-on state.

The pulse voltage generator 340 may include a voltage generator 342 that generates multiple voltages with various values. In detail, the voltage generator 342 may generate the first voltage that is positive and higher than the ground voltage VSS, and generate the second voltage that is the ground voltage VSS or lower than the ground voltage VSS. For example, the first voltage may be one selected from pumping voltage VPP, power voltage VDD, core voltage VCORE, precharge voltage, and the like, and the second voltage may be one selected from ground voltage VSS, back bias voltage VBB, negative word line voltage VBBW, and the like. The first pulse voltage and the second pulse voltage generated from the pulse voltage generator 340 may swing between the first voltage and the second voltage generated from the voltage generator 342. In this case, in order to prevent the GIDL due to the potential difference between the source S/drain D and the gate G of the cell transistor 311, the magnitude of the first voltage is preferably larger than a magnitude (absolute value) in the second voltage. As a result, average value of the first pulse voltage and the second pulse voltage is positive.

The drain of the cell transistor 311 is connected with the data storage unit 312 and the data storage unit 312 has a positive potential higher than the ground voltage VSS. For example, when storing the logic information '0', the drain may have a potential corresponding to the ground voltage VSS and when storing the logic information '1', the drain may have potential corresponding to the core voltage VCORE. Therefore, when a value of each of the first pulse voltage and the second pulse voltage, especially the first pulse voltage is positive, the potential difference between the gate and the drain may be minimized, and therefore the GIDL may be suppressed. In addition, the average values of the first pulse voltage and the second pulse voltage may be controlled through control of magnitudes of the first voltage and the second voltage, thereby easily coping with the fluctuation of the voltage supplied to the source S/drain D.

Further, the pulse voltage generator 340 may include a pulse generator 344 that generates a plurality of pulses having different frequencies. In detail, the pulse generator 344 may generate the first frequency and the second frequency lower than the first frequency. In this case, the first frequency and the second frequency are to control formation of the channel of the transistor 311. That is, the first frequency may be higher than the threshold frequency and the second frequency may be lower than the threshold frequency. The threshold frequency is a reference to form the channel of the transistor 311. For example, the threshold frequency may be approximately 100 kHz, the first frequency may be a frequency of 100 kHz or higher, and the second frequency may be a frequency lower than 100 kHz, for example, a frequency ranging from 0 kHz or 99 kHz. The channel of the cell transistor 311 is not formed in the first frequency and the channel of the cell transistor 311 is form in the second frequency.

The semiconductor device in accordance with the embodiment of the present Invention includes the pulse voltage generation unit 340 generating a pulse voltage that swings between voltages of which the average value is positive and that has a frequency controlling the formation of the channel of the cell transistor 311, thereby preventing the off-leakage of the cell transistor 311. Further, the embodiment of the present invention may secure the high potential of the gate with off state of the cell transistor 311, thereby alleviating the concerns caused by supplying of the negative voltage, for example, the negative word line voltage VBBW to the gate as discussed in the prior art.

In addition, the embodiment of the present invention may control the turn-on/off of the cell transistor 311 with the pulse voltage generated from the pulse voltage generator 340 to remove the process for controlling the turn-on/off characteristics of the cell transistor 311, for example, ion implantation process, and the like, from the manufacturing process, thereby improving the productivity of the semiconductor device. Further, it is possible to provide the cell transistor 311 with high speed operation without separate tuning in the process.

Meanwhile, the semiconductor memory device in accordance with the embodiment of the present invention activates the word lines, in an active operation mode where the data of the memory cells is transferred to the bit lines and sensed and amplified by the bit line sense amplifier 330, in a read operation mode where the data amplified by the bit line sense amplifier 330 is outputted to the outside through the data transmission line, and in a write operation mode where the external data transmitted through the data transmission line is transferred to the bit lines and stored in the memory cells.

On the other hand, the word lines are inactivated in a precharge operation mode where the memory cells are isolated from the bit lines and waits until a next active operation mode by precharge of the bit lines with precharge voltage VBLP. For reference, the read operation and the write operation are performed between the active operation and the precharge operation.

Hereinafter, supply of the pulse voltage generated from the pulse voltage generator 340 to the word lines with reference to the time from the precharge operation to the active operation will be described with reference to FIGS. 6 and 7.

Figure 7:
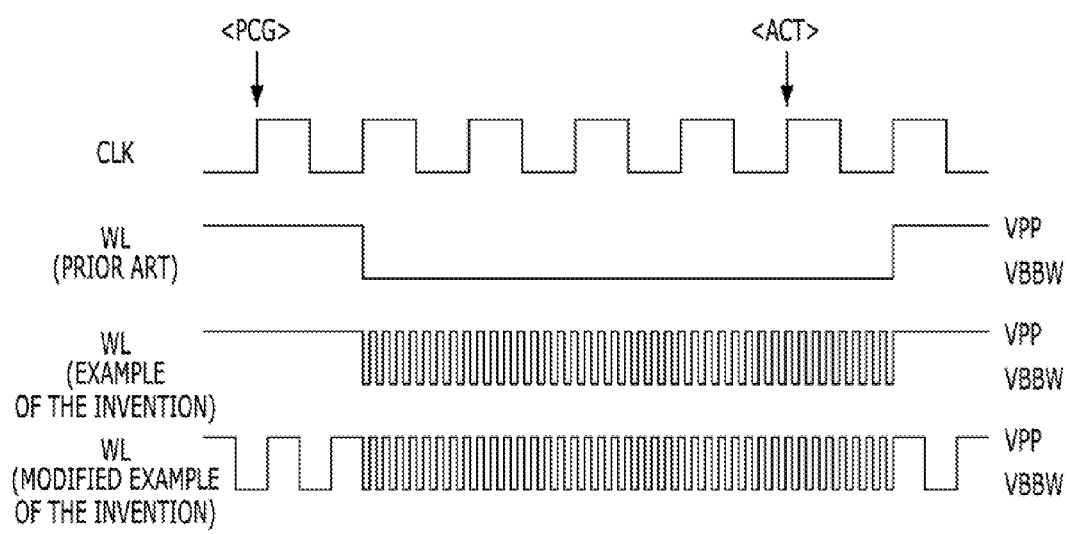
FIG. 7 is a timing diagram illustrating the semiconductor memory device in accordance with the embodiment of the present invention.

FIG. 7 is a timing diagram of the semiconductor memory device in accordance with the embodiment of the present invention.

As Illustrated in FIG. 7, the semiconductor memory device in accordance with the embodiment of the present invention is operated according to a reference clock CLK and may keep the word lines activated before a precharge command PCG is given. That is, the cell transistor 311 connected with the word line may be in a turn-on state in which the channel is formed on the substrate under the gate. When the precharge command PCG is given, the word lines are inactivated in response to the precharge command PCG and the word lines keep an inactivated state before an active command ACT is given. Thereafter, when the active command ACT is given, the word lines are back activated in response to the active command ACT.

In accordance with the prior art, the level voltage keeping the specific voltage value is supplied for the activation and inactivation of the word lines. For example, pumping voltage VPP is supplied for the activation of the word lines and the negative word line voltage VBBW is supplied for the inactivation of the word lines. In this case, the GIDL occurs due to the potential difference between the drain voltage and the negative word line voltage VBBW supplied to the gate of the cell transistor 311 during the inactivation of the word line, and therefore the characteristics may be deteriorated.

On the other hand, the semiconductor memory device in accordance with the embodiment of the present invention may supply the level voltage for the activation of the word lines and supply the first pulse voltage having the first frequency for the inactivation of the word lines. In this case, the first pulse voltage may have the frequency higher than the threshold frequency (for example, 100 kHz) to control the formation of the channel of the cell transistor 311, and swings between the pumping voltage VPP and the negative word line voltage VBBW. Therefore, in the precharge operation mode, that is, in case of the inactivation of the word lines, the cell transistor 311 is in a turn-off state and the gate is supplied with an average value of the pumping voltage VPP and the negative word line voltage VBBW, which is positive. Therefore, the potential difference between the gate and the drain may be minimized, thereby preventing the GIDL.

Further, the semiconductor memory device in accordance with the embodiment of the present invention may supply the second pulse voltage having the second frequency for the activation of the word lines and supply the first pulse voltage having the first frequency for the inactivation of the word lines. In this case, the first frequency may be higher than the threshold frequency and the second frequency may be lower than the threshold frequency. The first pulse voltage and the second pulse voltage may swing between the pumping voltage VPP and the negative word line voltage VBBW. Therefore, in the precharge operation mode, that is, in case of the inactivation of the word lines, the cell transistor 311 is in a turn-off state and the gate is supplied with an average value of the pumping voltage VPP and the negative word line voltage VBBW, which is positive. Therefore, the potential difference between the gate and the drain may be minimized, thereby preventing the GIDL from occurring.

Figure 8:
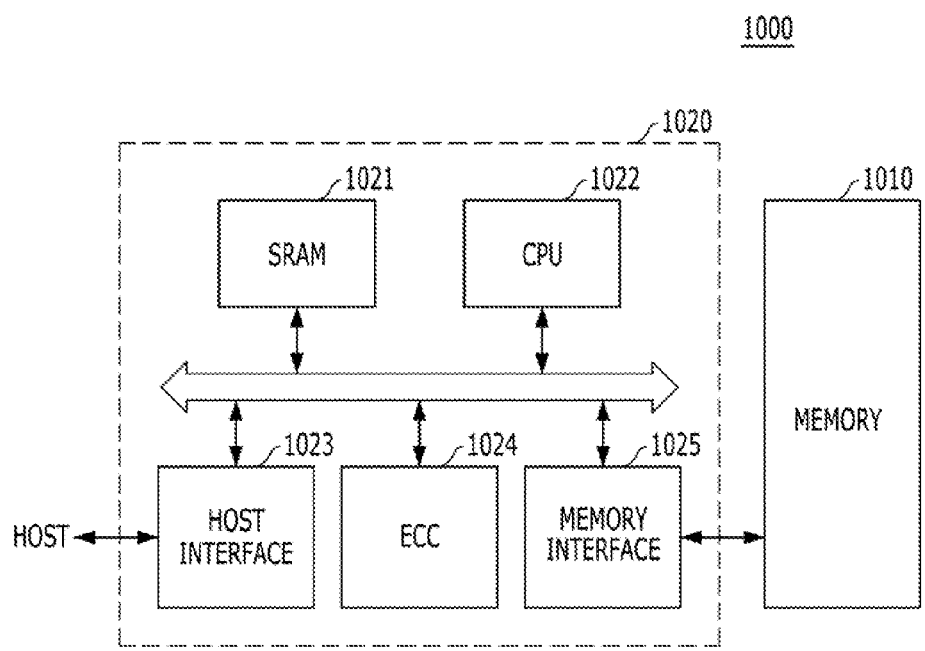
FIG. 8 is a block diagram illustrating a memory card including the semiconductor device in accordance with the embodiment of the present invention.

FIG. 8 is a block diagram illustrating a memory card including the semiconductor device in accordance with the embodiment of the present invention.

As illustrated in FIG. 8, the semiconductor device in accordance with the embodiment of the present invention may be applied to a memory card 1000. For example, the memory card 1000 may include a memory controller 1020 that controls the general data exchange between a host and a semiconductor memory 1010. The memory controller 1020 may include an SRAM 1021, a central processing unit (CPU) 1022, a host interface (host I/F) 1023, an error correction code (ECC) 1024, and a memory interface (I/F) 1025. The SRAM 1021 may be operated as an operation memory of the central processing apparatus 1022. The host interface 1023 may include a data exchange protocol of the host connected with the memory card 1000. The error correction code 1024 may detect and correct errors included in the data read from the semiconductor memory 1010. The memory interface 1025 interfaces the semiconductor memory 1010. The central processing unit 1022 performs a general control operation for data exchange of the memory controller 220.

The semiconductor memory 1010 applied in the memory card 1000 includes the semiconductor device including the pulse voltage generator in accordance with the embodiment of the present invention and the transistor of which the gate is connected with the output of the pulse voltage generator, thereby preventing the deterioration in the characteristics due to the off-leakage of the transistor.

Figure 9:
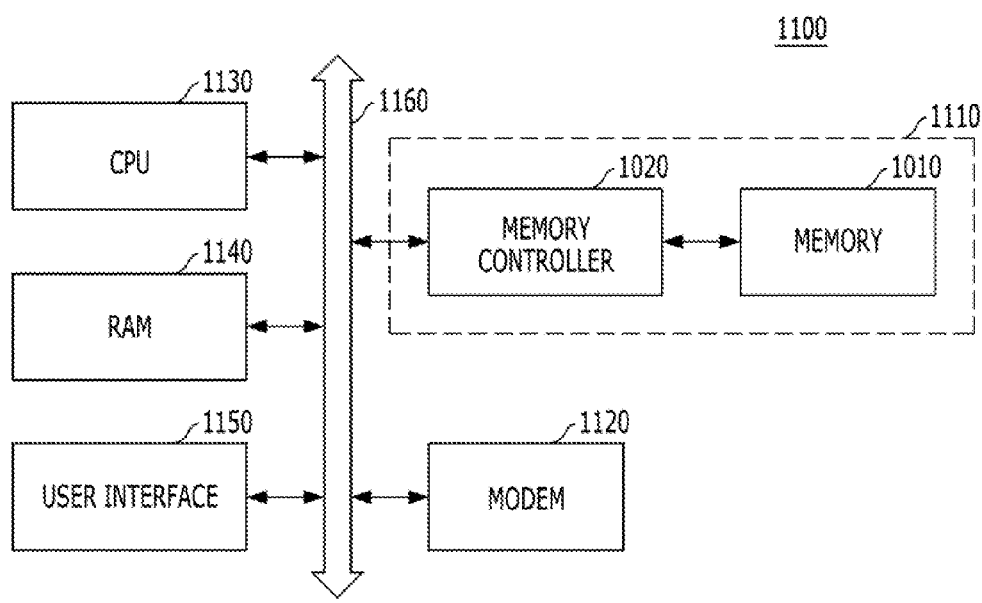
FIG. 9 is a block diagram schematically illustrating an example of an electronic system including the semiconductor device in accordance with the embodiment of the present invention.

FIG. 9 is a block diagram schematically illustrating an example of an electronic system including the semiconductor device in accordance with the embodiment of the present invention.

As illustrated in FIG. 9, an electronic system 1100 in accordance with the embodiment of the present invention may include a memory system 1110 and a modem 1120, a central processing unit 1130, a RAM 1140, and a user interface 1150 each connected with a system bus 1160. The memory system 1110 may be stored with data processed by the central processing unit 1130 and data input from the outside. The memory system 1110 may include the memory 1010 and the memory controller 1020 and may be configured to have substantially the same configuration as the memory card 1000 described with reference to FIG. 7.

The electronic system 1100 may be provided as a personal digital assistant (PDA), a portable computer, a web tablet, a wireless phone, a mobile phone, a digital music player, a memory card, all the electronic products that may transmit and/or receive information under the wireless environment, a semiconductor disk device (solid state disk), a camera image sensor, and other application chipsets.

The semiconductor device, the semiconductor memory device, or the electronic system in accordance with the embodiment of the present invention may be mounted as various types of packages. For example, the semiconductor device, the semiconductor memory device, or the electronic system in accordance with the embodiment of the present invention may be packaged and mounted as a method such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), wafer-level chip scale packages (WLCSPs), and the like.

As set forth above, the embodiment of the present invention includes the pulse voltage generator generating pulse voltage swinging between voltages, the average value of which is positive and having a frequency higher than the threshold frequency for control of the formation of the channel of the transistor, thereby preventing the off-leakage of the transistor.

Further, the embodiment of the present invention may secure the high potential of the gate with off state of the transistor, thereby alleviating the concerns caused by supplying the negative voltage, for example, the negative word line voltage VBBW to the gate as discussed in the prior art.

In addition, the embodiment of the present invention may control the turn-on/off of the transistor with the pulse voltage generated from the pulse voltage generator to remove the process for controlling the turn-on/off characteristics of the transistor from the manufacturing processes, thereby improving the productivity of the semiconductor device.

Moreover, since the embodiment of the present invention may control the turn-on/off of the transistor with the pulse voltage generated from the pulse voltage generator, it is possible to provide the transistor with high speed operation without separate tuning process.

Although the spirit of the present invention was described in detail with reference to the preferred embodiments, it should be understood that the preferred embodiments are provided to explain but do not limit the spirit of the present invention. Also, it is to be understood that various changes and modifications within the technical scope of the present invention may be made by a person having ordinary skill in the art to which this invention pertains.

What is claimed is:

1. A semiconductor memory device, comprising:
   a memory unit configured to include a plurality of memory cells including cell transistors and data storage units connected with drains of the cell transistors, a plurality of word lines connected with gates of the cell transistors, and a plurality of bit lines connected with sources of the cell transistors; and
   a pulse voltage generator configured to generate a first pulse voltage having a first frequency and a second pulse voltage having a second frequency lower than the first frequency,
   wherein the word line is supplied with the first pulse voltage for an inactivation of the word line, and the cell transistor is in an off state in response to the first pulse voltage, and
   the word line is supplied with the second pulse voltage for an activation of the word line, and the cell transistor is in an on state in response to the second pulse voltage.

2. The semiconductor memory device of claim 1, wherein each of the first pulse voltage and the second pulse voltage swings between a positive voltage and a ground voltage or between a positive voltage and a negative voltage.

3. The semiconductor memory device of claim 2, wherein a magnitude of the positive voltage is larger than a magnitude of the negative voltage.

4. The semiconductor memory device of claim 3, wherein a drain of the cell transistor has a potential higher than the ground voltage.

5. The semiconductor memory device of claim 1, wherein the first frequency is higher than a threshold frequency preventing formation of a channel of the cell transistor and the second frequency is lower than the threshold frequency.

6. The semiconductor memory device of claim 5, wherein the threshold frequency is approximately 100 kHz.

7. A semiconductor memory device, comprising:
a memory unit configured to include a plurality of memory cells including cell transistors and data storage units connected with drains of the cell transistors, a plurality of word lines connected with gates of the cell transistors, and a plurality of bit lines connected with sources of the cell transistors; and
a pulse voltage generator configured to generate a pulse voltage,
wherein the word line is supplied with the pulse voltage for a predetermined time in response to a precharge command to turn-off the cell transistor, and
wherein the pulse voltage has a frequency higher than a threshold frequency preventing formation of a channel of the cell transistor.

8. The semiconductor memory device of claim 7, wherein the pulse voltage swings between a positive voltage and a ground voltage or between a positive voltage and a negative voltage.

9. The semiconductor memory device of claim 8, wherein a magnitude of the positive voltage is larger than a magnitude of the negative voltage.

10. The semiconductor memory device of claim 9, wherein a drain of the cell transistor has a potential higher than the ground voltage.

11. The semiconductor memory device of claim 7, wherein the threshold frequency is approximately 100 kHz.

* * * * *